United States Patent [19]

Kingsley

[11] Patent Number: 4,872,103

[45] Date of Patent: Oct. 3, 1989

[54] METHOD OF POSITIONING TWO MODULES HAVING ANGLED EDGES

[75] Inventor: Christopher Kingsley, Valbonne, France

[73] Assignee: VLSI Technology, Inc., San Jose, Calif.

[21] Appl. No.: 127,210

[22] Filed: Dec. 1, 1987

[51] Int. Cl.[4] .............................................. G06F 15/60

[52] U.S. Cl. .................................... 364/153; 364/491; 364/300

[58] Field of Search ................ 364/490, 491, 153, 300

[56] References Cited

U.S. PATENT DOCUMENTS 4,630,219 12/1986 DiGiacomo et al. ........... 364/491 X

*Primary Examiner*—Allen MacDonald

*Attorney, Agent, or Firm*—Limbach, Limbach & Sutton

[57] ABSTRACT

In the present invention, a method for compacting two modules on a planar field is disclosed. Each of the modules has an edge which is closest to the other module and are positioned, if extended, to intersect with one another. Each of the edges is characterized by two end points. The method comprises determining if the edges intersect by divergence or by convergence. A constraint between one of the end points of one edge and one of the end points of the other edge is then calculated. The modules are then moved in a direction until the corrdinates of one of the end points of one edge and one of the end points of the other edge are separated by no less than the calculated constraint.

10 Claims, 1 Drawing Sheet

E1 E3 10 12 E2 E4

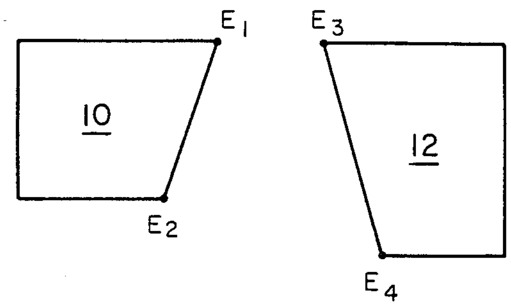
A/D FIG. 1
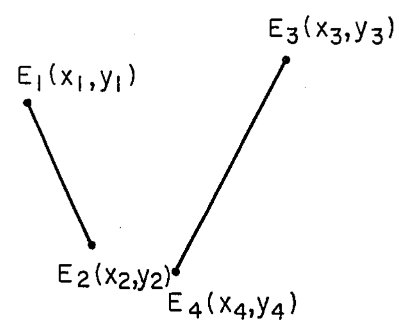
FIG. 2a
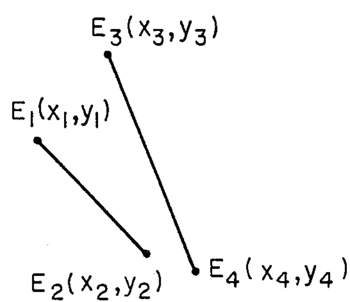
FIG. 2b
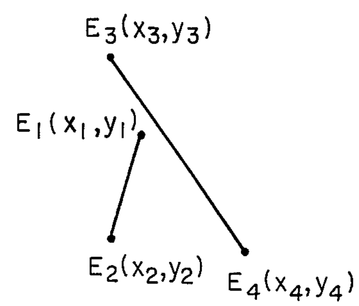
FIG. 2c
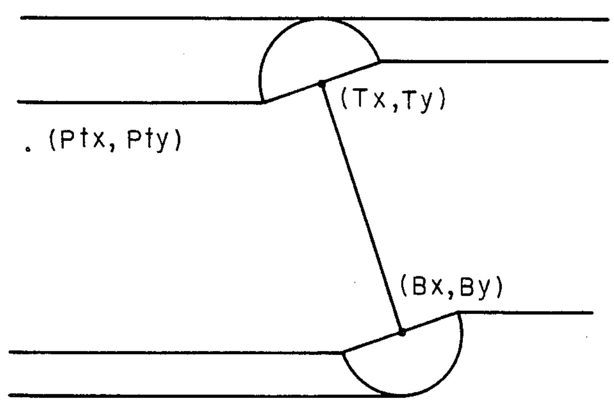
FIG. 3

METHOD OF POSITIONING TWO MODULES HAVING ANGLED EDGES

TECHNICAL FIELD

The present invention relates to a method of positioning two modules on a planar field defined by a rectilinear coordinate system with each of the modules having an edge which is closest to the other module, and with the two edges positioned, not necessarily parallel to one of the axis of the coordinate system. More particularly, the present invention relates to a machine process for compacting these two modules with a minimum number of calculations.

BACKGROUND OF THE INVENTION

Machine processes for compacting or positioning modules which are representative of semiconductor integrated circuits are well-known in the art. However, heretofore, such processes, typically known as compactors, have utilized a computer with a stored program to operate on modules which are rectangularly shaped and positioned in a rectilinear coordinate system, such as a Cartesian coordinate system, and with the edges of the modules parallel to the axis of the coordinate system. Heretofore, compaction of modules having edges that are not necessarily parallel to the axis of the rectilinear coordinate system, in which the modules are mapped, has not been done.

SUMMARY OF THE INVENTION

In the present invention, a method of positioning two modules on a planar field, in a rectilinear coordinate system, is disclosed. Each of the modules has an edge which is closest to the other module and the edges are positioned, not necessarily parallel to the axis of the coordinate system. Each edge is characterized by two end points. Each of the end points lies in a coordinate system with the end points having the following coordinates: $E_1(X_1,Y_1)$, $E_2(X_2,Y_2)$, $E_3(X_3,Y_3)$, $E_4(X_4,Y_4)$, where $E_1$ and $E_2$ are the end points of one of the edges and $E_3$ and $E_4$ are the end points of the other edge. The end points are further characterized by the edge $E_3$-$E_4$ being to one side of the edge $E_1$-$E_2$ in the increasing X direction, $Y_1 > Y_2$, and $Y_3 > Y_4$. The modules are moved in the X direction to one another. Further, the modules are prohibited from being separated by a distance less than a certain minimum distance S from one another at their closest points of separation. The method of the present invention comprises the steps of determining if the edges, if extended, intersect by divergence or convergence. A constraint between one of the end points of one edge and one of the end points of the other edge is then calculated, as a function of S. Finally, the modules are moved in the X direction until the X coordinates of one of the end points of one of the edges and one of the end points of the other edge are separated by no less than the calculated constraint.

BRIEF DESCRIPTION OF THE DRAWINGS

FIG. 1 is a plan view of the geometric shape of two modules lying in a planar field with each of the modules having an edge which is closest to the other module.

FIGS. *2a–2c* are graphic views of some of the various possible relationships between the two edges of the modules which are closest to one another.

FIG. 3 is a graphic view of the constraint of moving a point to an edge.

DETAILED DESCRIPTION OF THE DRAWINGS

Referring to FIG. 1, there is shown a plan view of a first module 10 and a second module 12 used in the method of the present invention. The first module 10 is characterized by having an edge defined by two end points ($E_1$ and $E_2$) with the edge $E_1$ - $E_2$ closest to the second module 12. The second module 12 is also characterized by having an edge defined by the end points $E_3$ and $E_4$ with the two end points $E_3$ and $E_4$ defining an edge $E_3$ - $E_4$ which is closest to the first module 10. The edges $E_1$ - $E_2$ and $E_3$ - $E_4$ are positioned, if extended, to intersect one another.

The end points $E_1$, $E_2$, $E_3$ and $E_4$ are defined in a rectilinear coordinate system, such as a Cartesian coordinate system, and have the following coordinates: $E_1(X_1,Y_1)$, $E_2(X_2,Y_2)$, $E_3(X_3,Y_3)$ and $E_4(X_4,Y_4)$. This can be seen in FIGS. *2a–2c*. Further, the end points are characterized by the edge $E_3$ - $E_4$ being to one side of the edge $E_1$ - $E_2$, in the increasing X direction. In short, as seen in FIG. *2a–2c*, the edge $E_3$ - $E_4$ is to the right of the edge $E_1$ - $E_2$. Finally, $Y_1 > Y_2$, and $Y_3 > Y_4$. Here, in accordance with FIGS. *2a–2c*, $E_1$ is above $E_2$, and $E_3$ is above $E_4$. It should be noted that the terms "above", "right" and other spatial relationship terms as used hereinabove, and hereinafter, are only with reference to the drawings and do not limit in any way the scope of the invention.

In the method of the present invention, the first and second modules 10 and 12 are generally representative of integrated circuits on a planar field. The method of the present invention comprises moving the first and second modules 10 and 12, respectively, in the X direction until the modules 10 and 12 can be as close as possible. In the example of the modules 10 and 12 being representative of semiconductor integrated circuits, there is a minimum constraint, caused by the design rules or the fabrication technology limitations, such that the modules cannot be separated by a distance less than a certain minimum distance designated as S. To compact the modules as close to one another as possible, the modules must be moved such that the distance of separation between the modules at their closest points of separation is S.

In the method of the present invention, the process begins by determining if the edges $E_1$ - $E_2$ and $E_3$ - $E_4$ intersect by divergence or by convergence. Thereafter, the constraint between one of the end points of one of the edges and one of the end points of the other edge is calculated. Finally, the modules 10 and 12 are moved in the X direction until the X coordinates of one of the end points of one of the edges and one of the end points of the other edge are separated by no less than the calculated constraint.

To determine if the edges $E_1$ - $E_2$ and $E_3$ - $E_4$ intersect by divergence or by convergence, the following calculation is made: If $X_2 \geqq X_1$ and $X_3 \geqq X_4$, then the edges are said to intersect by convergence. That is, the edges are positioned as shown in FIG. 2a where the "lower" end points, i.e., $E_2$ and $E_4$, if extended, would eventually intersect. Here, again, the definition of "lower" is only in the context of FIG. 2 and is in no way intended to limit the scope of the invention.

If the edges $E_1$ - $E_2$ and $E_3$ - $E_4$ intersect by convergence, there are two possibilities. The point of minimum separation of modules 10 and 12 will either be from $E_2$ to the edge $E_3$ - $E_4$, or it will be from the edge $E_1$ - $E_2$ to the point $E_4$. If $Y_2 > Y_4$, i.e. $E_2$ is above $E_4$, then the coordinates of $E_2$, i.e., $(X_2,Y_2)$ are chosen as (Ptx, Pty) and $(X_3,Y_3)$ are chosen as the coordinates for (Tx, Ty) and the coordinates $(X_4,Y_4)$ are chosen as the coordinates for (Bx, By) in the constraint calculation step.

Otherwise, if the edges $E_1$ - $E_2$ and $E_3$ - $E_4$ intersect by convergence, but if $Y_2 \leqq Y_4$, i.e. $E_2$ is not above $E_4$, then $(X_4, Y_4)$ are chosen as the coordinates for (Ptx, Pty) and the coordinates $(X_1,Y_1)$ are chosen as the coordinates for (Tx, Ty) and the coordinates $(X_2,Y_2)$ are chosen as the coordinates for (Bx, By) in the constraint calculation step.

If $X_1 \geqq X_2$ and $X_4 \geqq X_3$, i.e. FIG. 2c, then the edges $E_1$ - $E_2$ and $E_3$ - $E_4$ are said to intersect by divergence. That is, if the lines $E_1$ - $E_2$, and $E_3$ - $E_4$ are extended in the direction of $E_1$ and $E_3$, eventually those lines would intersect. Thus, the upper points $E_1$ and $E_3$, if extended further along $E_1$ - $E_2$ and $E_3$ - $E_4$, would eventually intersect. Here, again, the notation of "upper" is meant only as a direction in reference to FIG. 2 and does not in any way limit the invention.

If the edges $E_1$ - $E_2$ and $E_3$ - $E_4$ intersect by divergence, then there are also two possibilities. The point of minimum separation of modules 10 and 12 will either be from $E_1$ to the edge $E_3$ - $E_4$ or it will be from the edge $E_1$ - $E_2$ to the point $E_3$. If $Y_1 > Y_3$, then the coordinates $(X_3,Y_3)$ are chosen as the coordinates of (Ptx, Pty) and the coordinates $(X_1,Y_1)$ are chosen as the coordinates of (Tx, Ty), and the coordinates $(X_2,Y_2)$ are chosen as the coordinates of (Bx, By) in the constraint calculation step.

Otherwise, if the lines $E_1$ - $E_2$ and $E_3$ - $E_4$ intersect by divergence but if $Y_1 \leqq Y_3$, the coordinates $(X_1,Y_1)$ are chosen as the coordinates of (Ptx, Pty) and the coordinates $(X_3,Y_3)$ are chosen as the coordinates of (Tx, Ty), and the coordinates $(X_4, Y_4)$ are chosen as the coordinates of (Bx, By) in the constraint calculation step.

Finally, if the relationship of $X_1$, $X_2$, $X_3$ and $X_4$ are not found as previously stated, i.e. FIG. 2b, then the slopes of the lines $E_1$ - $E_2$ and $E_3$ - $E_4$ are calculated. $M_1$ is designated as the calculated slope of line $E_1$ - $E_2$ and $M_2$ is the calculated slope of line $E_3$ - $E_4$. Slope is defined as dx/dy, instead of the usual definition of slope, which is dy/dx.

If $M_1 > M_2$, the edges are said to intersect by divergence. In that event, however, the calculation of the constraint between $E_3(X_3,Y_3)$ and the line $E_1$ - $E_2$ is calculated as a first constraint and the constraint between the point $E_1(X_1,Y_1)$ to the line $E_3$ - $E_4$ is calculated as the second constraint. Here, again, similar to the discussions heretofore, if $E_3$ to $E_1$ - $E_2$ constraint is to be calculated, then the coordinates $(X_3,Y_3)$ are chosen as the coordinates (Ptx, Pty) and the coordinates $(X_1,Y_1)$ are chosen as the coordinates (Tx, Ty) and the coordinates $(X_2,Y_2)$ are chosen as the coordinates of (Bx,By) in the constraint calculation step for calculating the first constraint. For calculating the second constraint, the coordinates $(X_1,Y_1)$ are chosen as the coordinates of (Ptx, Pty) and the coordinates $(X_3,Y_3)$ are chosen as the coordinates of (Tx, Ty), and the coordinates $(X_4,Y_4)$ are chosen as the coordinates of (Bx, By).

If, however, $M_2 \geqq M_1$, the edges $E_1$ - $E_2$ and $E_3$ - $E_4$ are said to intersect by convergence. The point $E_2$ and the edges $E_3$ - $E_4$ are chosen in the constraint calculation step to calculate a first constraint and the point $E_4$ to the edge $E_1$ - $E_2$ is chosen in the constraint calculation step to calculate the second constraint. In the calculation of the first constraint, the coordinates $(X_2, Y_2)$ are chosen as the coordinates of (Ptx, Pty) and the coordinates $(X_3,Y_3)$ are chosen as the coordinates of (Tx, Ty) and the coordinates $(X_4,Y_4)$ are chosen as the coordinates of (Bx, By) in the constraint calculation step. For calculation of the second constraint, the coordinates of $(X_4,Y_4)$ are chosen as the coordinates of (Ptx,Pty) and the coordinates $(X_1,Y_1)$ are chosen as the coordinates of (Tx, Ty), and the coordinates $(X_2,Y_2)$ are chosen as the coordinates of (Bx, By) in the constraint calculation step.

In the event the third case is chosen, i.e., where two constraints are to be calculated, the first and second constraints are calculated and, thereafter, the larger constraint is selected and is used in the moving step.

Referring to FIG. 3, there is shown graphically a point having the coordinates (Ptx, Pty) and an edge, one end of which has the coordinates (Tx, Ty) and the other edge has teh coordinates (Bx, By).

The constraint, D, between the points (Ptx, Pty) and the edge having the coordinates (Tx, Ty) and (Bx, By), is calculated to be minus infinity, or no constraint, if Pty is less than or equal to By−S. This would be the case where the point (Ptx, Pty) lies "below" the coordinates of the lowermost end point having the coordinates (Bx, By) with the minimum distance S separation required. Thus, the constraint is said to be non-existent and the point (Ptx, Pty) may be anywhere in relationship to the line (Tx, Ty)−(Bx, By).

If the coördinate of Pty satisfies the following: $Pty \leqq By - S$, then there is no constraint.

If the coordinate of Pty satisfies the following:

$$Pty < By \pm S^{*}dx/m,$$

where + is used if (Ptx,Pty) is to the left of the line $E_1$ - $E_2$, and - is used if (Ptx,Pty) is to the right of the line $E_3$ - $E_4$, then the constraint D is calculated as $$D = \sqrt{S^2 - (Pty - By)^2}$$

If $Pty \leqq Ty \pm S^{*}dx/m$, where + is used if (Ptx,Pty) is to the left of the line $E_3$ - $E_4$ and - is used if (Ptx,Pty) is to the right of the line $E_1$ - $E_2$, then D is calculated as $$D = (S^{*}m \pm dx^{*}(Pty - By))/dy$$

If $Pty < Ty + S$, then the constraint D is calculated as $$D = \sqrt{S^2 - (Pty - Ty)^2} \pm dx$$

where + is used if (Ptx,Pty) is to the left of the line $E_3$ - $E_4$ and - is used if (Ptx,Pty) is to the right of the line $E_1$ - $E_2$.

Finally, the constraint D is chosen to be again as minus infinity if $Pty \leqq Ty + S$.

In all of the foregoing, D is the constraint; dx is Tx−Bx; dy is Ty−By; and m is $$= \sqrt{dx^2 + dy^2}$$

Once the constraint D is calculated, the modules 10 and 12 are moved in the X direction to one another until $Ptx \leqq Bx - D$ if $Ptx < Bx$, or until $Ptx \leqq Bx + D$ if $Ptx > Bx$.

In a preferred embodiment, the method of the present invention is practiced by a machine process using a computer with a stored program. A copy of a computer program running on the Apollo DN660 computer is attached herewith as Exhibit A.

It should be noted that there are many advantages to the method of the present invention. First and foremost is that as semiconductor integrated circuits are reduced in size, it becomes crucial to use every part of the silicon wafer or silicon die. Thus, semiconductor integrated circuits need not be constrained to lie on a rectangularly-shaped module. Instead, the designer must have freedom to choose the shape of the module in which the integrated circuits will lie. This raises the problem of compacting modules which are not rectangularly-shaped. The method of the present invention is a solution to the foregoing problem.

Further, it should be noted that, in the method of the present invention, by simply noting whether or not the edges of the two modules 10 and 12 diverge or converge, and the relationship of the end points of the edges to one another, for two of the three cases, only one constraint calculation is needed. For the third case, only two constraints are calculated and compared. By simply noting the divergence or convergence of the edges $E_1$ - $E_2$ and $E_3$ - $E_4$, and the relative position of the end points, much of the calculation for the constraints can be easily made.

Of course, the coordinates of X and Y can be interchanged and the invention can be practiced in the same manner as well.

What is claimed is:

1. A method of positioning two modules in a planar field, each of said modules having an edge which is closest to the other module and each edge is characterized by two endpoints, said endpoints lie in a rectilinear coordinate system having the following coordintes $E_1$ $(x_1,y_1)$, $E_2$ $(x_2,y_2)$, $E_3$ $(x_3,y_3)$, $E_4$ $(x_4,y_4)$, where $E_1$ and $E_2$ are the end points of one edge and $E_3$ and $E_4$ are the endpoints of the other edge, said endpoints characterized by the edge $E_3$ - $E_4$ being to one side of the edge $E_1$ - $E_2$, in the increasing x direction, $y_1 > y_2$ and $y_3 > y_4$ and with the two edges positioned, not necessarily parallel to one of the axis of the coordinate system, said method including the step of moving said modules in the x direction to one another, and further wherein the modules cannot be separated by a distance less than a minimum distance, S, from one another, at their closest points of separation, said method comprising the steps of:

determining if the edges, if extended, intersect by divergence or by convergence;

calculating a constraint between one of said endpoints of one edge and one of the endpoints of the other edge, as a function of S; and moving said modules in said x direction until the x coordinates of one of said endpoints of one edge and one of the endpoints of the other edge are separated by no less than said calculated constraint.

2. The method of claim 1 wherein said determining step further comprises the steps of:

(a) determining if $x_2 \geqq x_1$ and $x_3 \geqq x_4$, then said edges intersect by convergence and (i) if $y_2 > y_4$ choosing $(x_2,y_2)$ as (Ptx,Pty) and $(x_3,y_3)$ as (Tx,Ty) and $(x_4,y_4)$ as (Bx,By) in the constraint calculation step;

(ii) if $y_4 \geqq y_2$ choosing $(x_4,y_4)$ as (Ptx,Pty) and $(x_1,y_1)$ as (Tx,Ty) and $(x_2,y_2)$ as (Bx,By) in the constraint calculation step;

(b) determining if $x_1 \geqq x_2$ and $x_4 \geqq x_3$, then said edges intersect by divergence and (i) if $y_1 > y_3$ choosing $(x_3,y_3)$ as (Ptx,Pty) and $(x_1,y_1)$ as (Tx,Ty) and $(x_2,y_2)$ as (Bx,By) in the constraint calculation step;

(ii) if $y_3 \geqq y_1$ choosing $(x_1,y_1)$ as (Ptx,Pty) and $(x_3,y_3)$ as (Tx,Ty) and $(x_4,y_4)$ as (Bx,By) in the constraint calculation step; and (c) determining if the relationship of $x_1$, $x_2$, $x_3$ and $x_4$ are not found in steps (a) or (b), then calculating the slopes of the lines $E_1$-$E_2$ and $E_3$-$E_4$ where $m_1$ is the slope of line $E_1$-$E_2$ and $m_2$ is the slope of $E_3$-$E_4$, where slope is dx/dy, then if (i) $m_2 < m_1$, said edges intersect by divergence and choosing $(x_3,y_3)$ as (Ptx,Pty) and $(x_1,y_1)$ as (Tx,Ty) and $(x_2,y_2)$ as (Bx,By) in the constraint calculation step to calculate a first constraint; choosing $(x_1,y_1)$ as (Ptx,Pty) and $(x_3,y_3)$ as (Tx,Ty) and $(x_4,y_4)$ as (Bx,By) in the constraint calculation step to calculate a second constraint; and (ii) $m_2 \geqq m_1$, said edges intersect by convergence and choosing $(x_2,y_2)$ as (Ptx,Pty) and $(x_3,y_3)$ as (Tx,Ty) and $x_4,y_4)$ as (Bx,By) in the constraint calculation step to calculate a first constraint; choosing $(x_4,y_4)$ as (Ptx,Pty) and $(x_1,y_1)$ as (Tx,Ty) and $(x_2,y_2)$ as (Bx,By) in the constraint calculation step to calculate a second constraint;

where Ptx, Pty, Bx, By, Tx, and Ty are coordinate values.

3. The method of claim 2 further comprising the step of comparing said first constraint to said second constraint (in the event step 2(*c*) is chosen) and selecting the larger number as the constraint; after said calculating step and prior to said moving step.

4. The method of claim 3 wherein said calculating step comprises:.

(a) choosing d=minus infinity or no constraint, if $Pty \leqq By - S$;

(b) choosing $$d = \sqrt{S^2 - (Pty - By)^2}$$

if $Pty < By \pm S*dx/m$ where + is used if (Ptx,Pty) is to the left of the line $E_1$ - $E_2$, and − is used if (Ptx,Pty) is to the right of the line $E_3$ - $E_4$;

(c) choosing $d = (S*m \pm dx*(Pty - By))/dy$ if $Pty \leqq Ty \pm S*dx/m$ where + is used if (Ptx,Pty) is to the left of the line $E_3$ - $E_4$, and − is used if (Ptx,Pty) is to the right of the line $E_1$ - $E_2$;

(d) choosing $$d = \sqrt{S^2 - (Pty - Ty)^2} \pm dx$$

if $Pty < Ty + S$ where + is used if (Ptx,Pty) is to the right of the line $E_3$ - $E_4$, and − is used if (Ptx,Pty) is to the left of the line $E_1$ - $E_2$; or (e) choosing d=minus infinity, or no constraint, if $Pty \geqq Ty + S$; where d is the constraint, $dx = Tx - Bx$, $dy = Ty - By$, and $$m = \sqrt{dx^2 + dy^2}.$$

5. The method of claim 4 wherein said moving step comprises:

moving said modules in the x direction to one another until, $Ptx < Bx - d$ if $Ptx < Bx$, or $Ptx \geqq Bx + d$ if $Ptx > Bx$.

6. In a machine process for compacting two modules, representative of integrated circuits, on a planar field, each of said modules having an edge which is closest to the other module and each edge is characterized by two endpoints, said endpoints lie in a rectilinear coordinate system having the following coordinates $E_1$ $(x_1,y_1)$, $E_2$ $(x_2,y_2)$, $E_3$ $(x_3,y_3)$, $E_4$ $(x_4,y_4)$, where $E_1$ and $E_2$ are the endpoints of one of said edges, and $E_3$ and $E_4$ are the endpoints of the other edge, said endpoints characterized by the edge $E_3$ - $E_4$ being to one side of the edge $E_1$ - $E_2$ in the increasing x direction, $y_1 > y_2$ and $y_3 > y_4$ and wherein said edges are positioned, not necessarily parallel to one of the axis of the coordinate system, said machine process utilizing a computer with a stored program for moving said modules in the x direction to one another, further wherein the modules cannot be separated by a distance less than a minimum distance, S, from one another, at their closest points of separation, said method comprising the steps of:

determining if the edges, if extended, intersect by divergence or by convergence;

calculating the constraint between one of said endpoints of one edge and one of the endpoints of the other edge, as a function of S; and moving said modules in said x direction until the x coordinates of one of said endpoints of one edge and one of the endpoints of the other edge are separated by no less than said constraint.

7. The method of claim 6 wherein said determining step further comprises the steps of:

(a) determining if $x_2 \geqq x_1$ and $x_3 \geqq x_4$, then said edges intersect by convergence and (i) if $y_2 > y_4$ choosing $(x_2,y_2)$ as (Ptx,Pty) and $(x_3,y_3)$ as (Tx,Ty) and $(x_4,y_4)$ as (Bx,By) in the constraint calculation step;

(ii) if $y_4 \geqq y_2$ choosing $(x_4,y_4)$ as (Ptx,Pty) and $(x_1,y_1)$ as (Tx,Ty) and $(x_2,y_2)$ as (Bx,By) in the constraint calculation step;

(b) determining if $x_1 \geqq x_2$ and $x_4 \geqq x_3$, then said edges intersect by divergence and (i) if $y_1 > y_3$ choosing $(x_3,y_3)$ as (Ptx,Pty) and $(x_1,y_1)$ as (Tx,Ty) and $(x_2,y_2)$ as (Bx,By) in the constraint calculation step;

(ii) if $y_3 \geqq y_1$ choosing $(x_1,y_1)$ as (Ptx,Pty) and $(x_3,y_3)$ as (Tx,Ty) and $(x_4,y_4)$ as (Bx,By) in the constraint calculation step; and (c) determining if the relationship of $x_1$, $x_2$, $x_3$ and $x_4$ are not found in steps (a) or (b), then calculating the slopes of the lines $E_1$-$E_2$ and $E_3$-$E_4$ where $m_1$ is the slope of line $E_1$-$E_2$ and $m_2$ is the slope of $E_3$-$E_4$, where slope is dx/dy, then if (i) $m_2 < m_1$, said edges intersect by divergence and choosing $(x_3,y_3)$ as (Ptx,Pty) and $(x_1,y_1)$ as (Tx,Ty) and $(x_2,y_2)$ as (Bx,By) in the constraint calculation step to calculate a first constraint; choosing $(x_1,y_1)$ as (Ptx,Pty) and $(x_3,y_3)$ as (Tx,Ty) and $(x_4,y_4)$ as (Bx,By) in the constraint calculation step to calculate a second constraint; and (ii) $m_2 \geqq m_1$, said edges intersect by convergence and choosing $(x_2,y_2)$ as (Ptx,Pty) and $(x_3,y_3)$ as (Tx,Ty) and $(x_4,y_4)$ as (Bx,By) in the constraint calculation step to calculate a first constraint; choosing $(x_4,y_4)$ as (Ptx,Pty) and $(x_1,y_1)$ as (Tx,Ty) and $(x_2,y_2)$ as (Bx,By) in the constraint calculation step to calculate a second constraint;

where Ptx, Pty, Bx, By, Tx and Ty are coordinate values.

8. The method of claim 7 further comprising the step of comparing said first constraint to said second constraint (in the event step 2(*c*) is chosen) and selecting the larger number as the constraint; after said calculating step and prior to said moving step.

9. The method of claim 8 wherein said calculating step comprises:

(a) choosing d=minus infinity, or no constraint, if $Pty \leqq By - S$;

(b) choosing $$d = \sqrt{S^2 - (Pty - By)^2}$$

if $Pty < By \pm S*dx/m$ where + is used if (Ptx,Pty) is to the left of the line $E_1$ - $E_2$, and − is used if (Ptx,Pty) is to the right of the line $E_3$ - $E_4$;

(c) choosing $d = (S*m \pm dx*(Pty - By))/dy$ if $Pty \leqq Ty \pm S*dx/m$ where + is used if (Ptx,Pty) is to the left of the line $E_3$ - $E_4$, and − is used if (Ptx,Pty) is to the right of the line $E_1$ - $E_2$;

(d) choosing $$d = \sqrt{S^2 - (Pty - Ty)^2} \pm dx$$

if $Pty < Ty + S$ where + is used if (Ptx,Pty) is to the right of the line $E_3$ - $E_4$, and − is used if (Ptx,Pty) is to the left of the line $E_1$ - $E_2$; or (e) choosing d=minus infinity, or no constraint, if $Pty \geqq Ty + S$; where d is the constraint, $dx = Tx - Bx$, $dy = Ty - By$, and $$m = \sqrt{dx^2 + dy^2}.$$

10. The method of claim 9 wherein said moving step comprises:

moving said modules in the x direction to one another until, $Ptx \leqq Bx - d$ if $Ptx < Bx$, or $Ptx \geqq Bx + d$ if $Ptx > Bx$.

* * * * *